(12) United States Patent
Lee

(10) Patent No.: US 7,541,286 B2
(45) Date of Patent: Jun. 2, 2009

(54) METHOD FOR MANUFACTURING SEMICONDUCTOR DEVICE USING KRF LIGHT SOURCE

(75) Inventor: Chang-Myung Lee, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 11/846,915

(22) Filed: Aug. 29, 2007

(65) Prior Publication Data
US 2008/0064193 A1 Mar. 13, 2008

(30) Foreign Application Priority Data
Sep. 8, 2006 (KR) ...................... 10-2006-0086664

(51) Int. Cl.
*H01L 21/00* (2006.01)
(52) U.S. Cl. ........................... 438/689; 216/67; 216/17; 216/41; 438/717; 438/719; 438/723; 438/745; 438/756; 257/E21.029; 257/E21.206; 257/E21.256; 257/E21.314
(58) Field of Classification Search ................. 438/689, 438/717, 719, 723, 745, 753, 756, 947; 257/E21.029, 257/206, 252, 314; 216/17, 41, 67
See application file for complete search history.

(56) References Cited

U.S. PATENT DOCUMENTS

| 5,539,249 | A | * | 7/1996 | Roman et al. ................ 257/649 |
| 5,591,566 | A | * | 1/1997 | Ogawa ........................ 430/325 |
| 6,136,679 | A | * | 10/2000 | Yu et al. ..................... 438/592 |
| 6,187,687 | B1 | * | 2/2001 | Plat et al. .................... 438/724 |
| 6,309,926 | B1 | * | 10/2001 | Bell et al. .................... 438/257 |
| 6,365,320 | B1 | * | 4/2002 | Foote et al. ............... 430/270.1 |
| 6,518,206 | B1 | * | 2/2003 | Kumar et al. ................ 438/585 |
| 6,524,964 | B2 | * | 2/2003 | Yu .............................. 438/736 |
| 6,541,164 | B1 | * | 4/2003 | Kumar et al. .................. 430/5 |
| 6,548,423 | B1 | * | 4/2003 | Plat et al. .................... 438/780 |
| 6,605,394 | B2 | * | 8/2003 | Montgomery et al. .......... 430/5 |
| 6,818,141 | B1 | * | 11/2004 | Plat et al. ....................... 216/67 |
| 7,186,649 | B2 | * | 3/2007 | Shim et al. .................. 438/689 |

\* cited by examiner

*Primary Examiner*—Michael S Lebentritt
(74) *Attorney, Agent, or Firm*—Sherr & Vaughn, PLLC

(57) ABSTRACT

A semiconductor device manufacturing method using a KrF light source is disclosed. Embodiments relate to a method for manufacturing a semiconductor device including forming an oxide film over a semiconductor substrate. A gate conductor may be formed over the oxide film. An antireflective film may be formed over the gate conductor. A photoresist film may be formed over the antireflective film. The photoresist film may be photo-etched, thereby forming a first photoresist film pattern having a first line width. The antireflective film may be etched, using the first photoresist film pattern as a mask, thereby forming an antireflective film pattern. The first photoresist film pattern may be simultaneously laterally etched, thereby forming a second photoresist film pattern having a second line width corresponding to a final design value for the gate conductor. The gate conductor and the oxide film may be etched, using the second photoresist film pattern and the antireflective film pattern as a mask, thereby forming a gate conductor pattern and an oxide film pattern. The photo-etching to form the first photoresist film pattern may be executed, using a KrF light source. Accordingly, it is possible to provide a method for manufacturing a semiconductor device for a 100 nm line width or lower, using a KrF light source, without using an ArF light source requiring the use of expensive equipment and a specific photoresist material.

8 Claims, 5 Drawing Sheets

BARC ETCHING

PRIMARY MAIN ETCHING

SECONDARY MAIN ETCHING

OVER ETCHING

METHOD FOR MANUFACTURING SEMICONDUCTOR DEVICE USING KRF LIGHT SOURCE

Figure 1A:
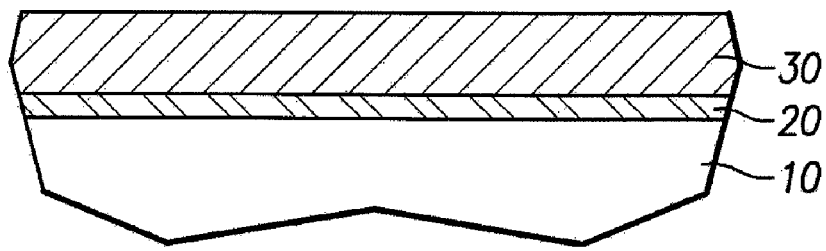

The present application claims priority under 35 U.S.C. 119 to Korean Patent Application No. 10-2006-0086664, filed on Sep. 8, 2006, which is hereby incorporated by reference in its entirety.

BACKGROUND

Manufacturing transistors which perform properly requires accurate and stable photolithography and process techniques. Design rules for transistors have become more strict due to ever larger scale integration of semiconductor devices. It is necessary to use an ArF light source, instead of a KrF light source, for the manufacture of transistors with a line width of 100 nm or less. The resolution in a photolithography process is inversely proportional to the wavelength of an exposure light source. The wavelength of a KrF excimer laser is 248 nm, whereas the wavelength of an ArF excimer laser is 193 nm. However, the ArF light source requires expensive equipment and a specific photoresist material. This may increase the manufacturing costs of the semiconductor device.

SUMMARY

Embodiments relate to semiconductor techniques, and more particularly, to a method for manufacturing a semiconductor device having a gate line width of 100 nm or less, using a KrF light source.

Embodiments relate to a method for manufacturing a semiconductor device including forming an oxide film over a semiconductor substrate. A gate conductor may be formed over the oxide film. An antireflective film may be formed over the gate conductor. A photoresist film may be formed over the antireflective film. The photoresist film may be photo-etched, thereby forming a first photoresist film pattern having a first line width. The antireflective film may be etched, using the first photoresist film pattern as a mask, thereby forming an antireflective film pattern. The first photoresist film pattern may be simultaneously laterally etched, thereby forming a second photoresist film pattern having a second line width corresponding to a final design value for the gate conductor. The gate conductor and the oxide film may be etched, using the second photoresist film pattern and the antireflective film pattern as a mask, thereby forming a gate conductor pattern and an oxide film pattern. The photo-etching to form the first photoresist film pattern is executed using a KrF light source.

The step of etching the antireflective film to form the antireflective film pattern may be executed, using a $CF_4$ gas. In detail, the step of etching the antireflective film may be executed under process conditions of approximately 10 through 30 mT (chamber pressure)/approximately 500 through 1000 W (source power), approximately 30 through 70 W (bias power)/HeO2 of approximately 40 through 70 sccm, CF4 of approximately 100 through 200 sccm, Ar of approximately 100 through 200 sccm. The step of etching the gate conductor, using the second photoresist film pattern and the antireflective film pattern as mask, may include a main etching procedure, a soft landing procedure, and an over-etching procedure each using an HBr/Cl2 gas. The main etching procedure may be executed under process conditions of approximately 3 through 10 mT (chamber pressure)/approximately 400 to 1000 W (source power), approximately 50 through 200 W (bias power)/Cl2 of approximately 30 through 80 sccm, HBr of approximately 150 through 300, HeO2 of approximately 15 through 30 sccm. The soft landing procedure may be executed under process conditions of approximately 15 through 40 mT(chamber pressure)/approximately 300 through 600 W (source power), approximately 40 through 100 W (bias power)/Cl2 of approximately 50 through 150 sccm, HBr of approximately 200 through 400 sccm, HeO2 of approximately 20 through 50 sccm. The over-etching procedure may be executed under process conditions of approximately 50 through 100 mT(chamber pressure)/approximately 500 through 1000 W(source power), approximately 40 through 100 W (bias power)/HBr of approximately 200 through 700 sccm, HeO2 of approximately 5 through 30 sccm.

DRAWINGS

Figure 2A:
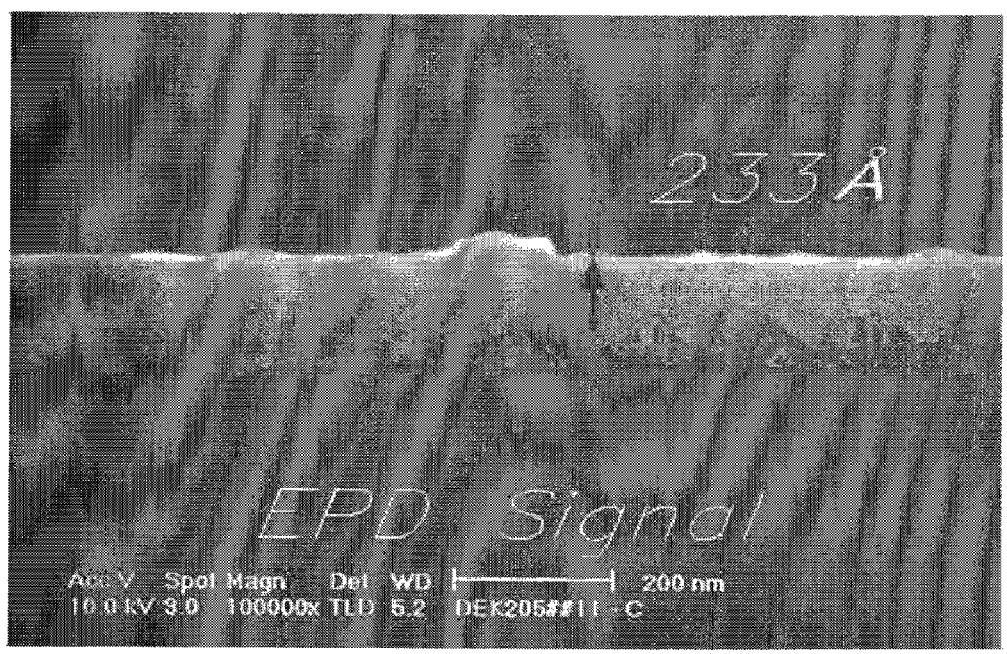
Figure 2B:
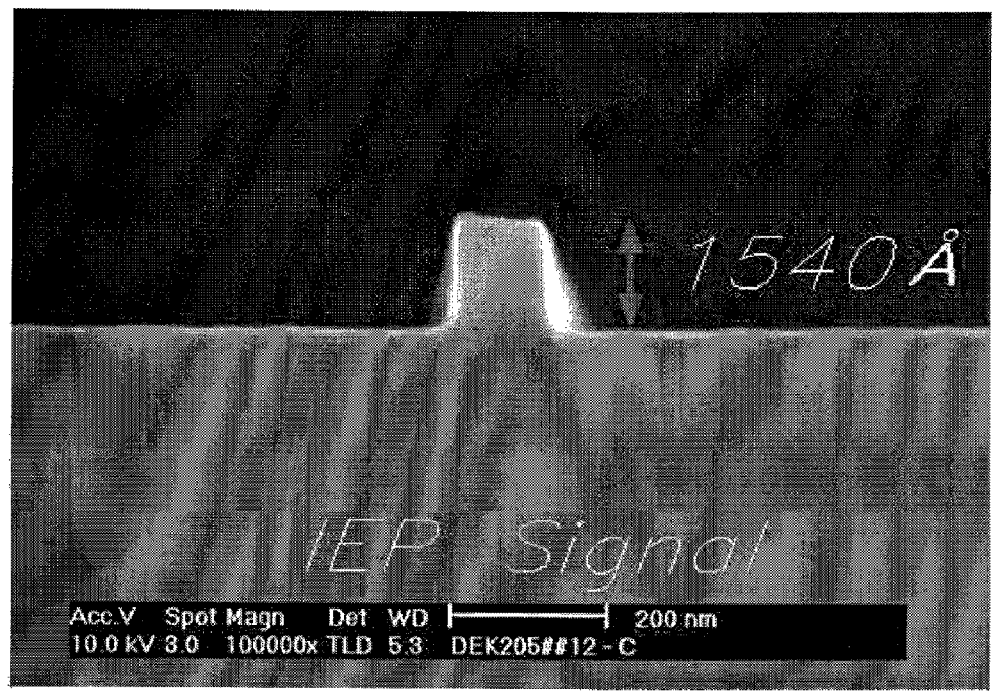
Figure 2C:
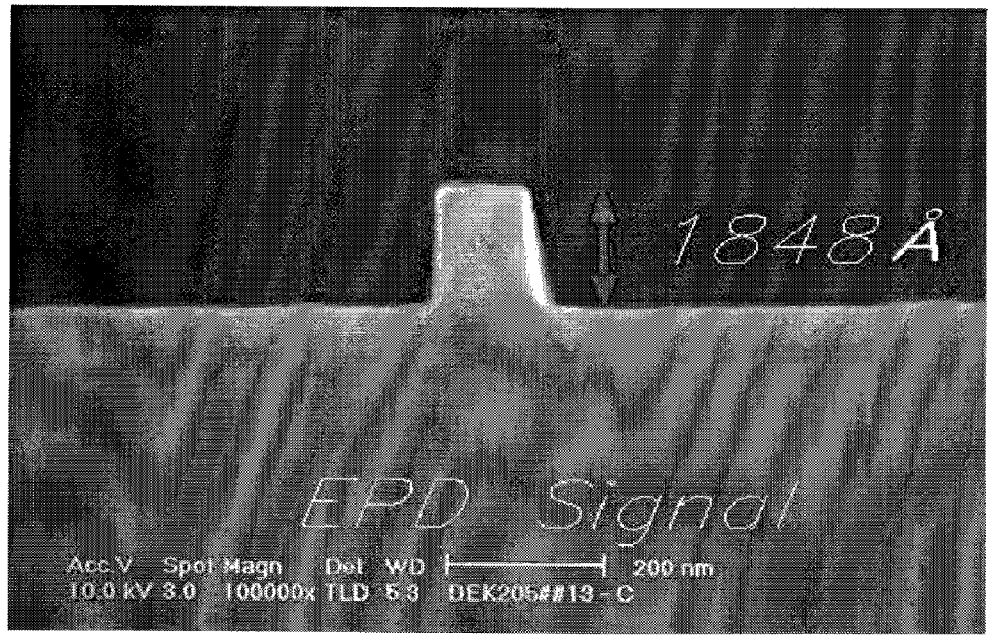
Figure 2D:
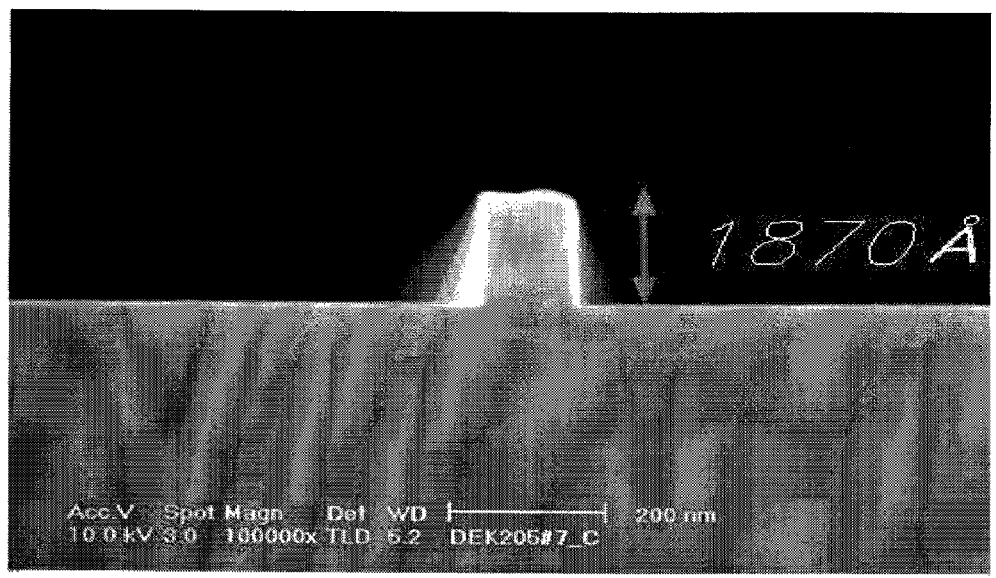
Figure 3:
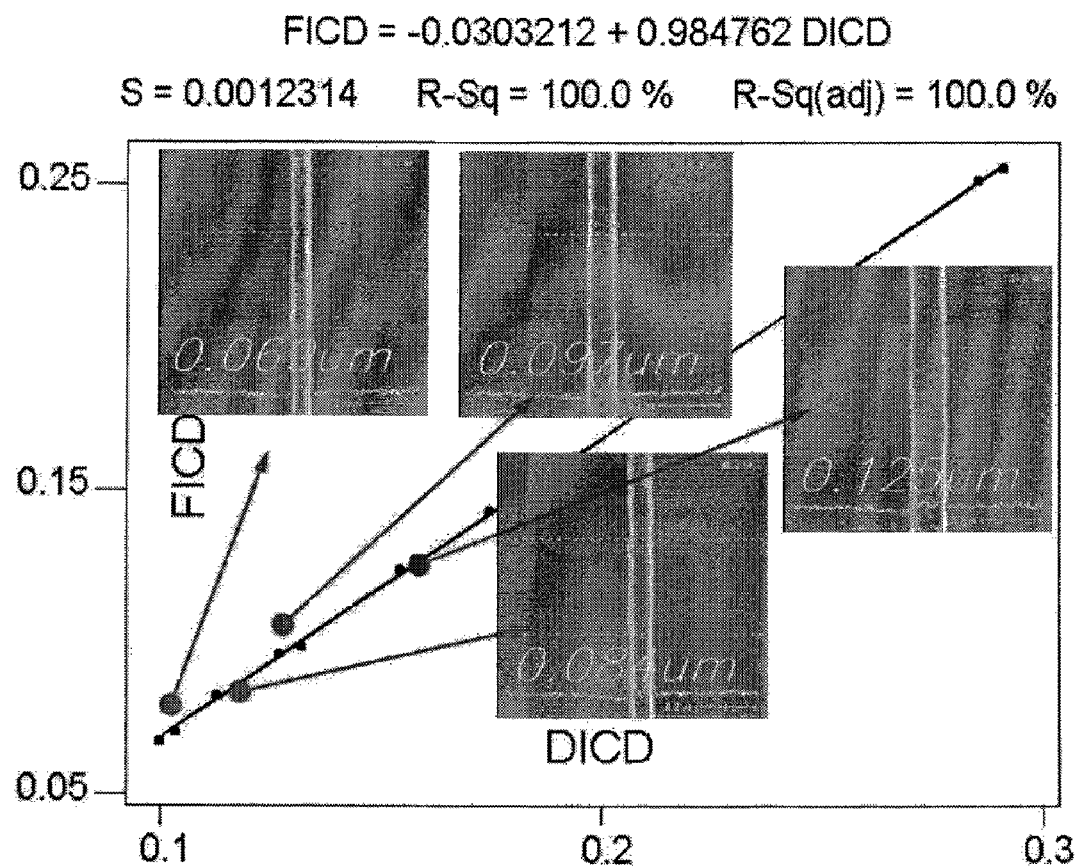

Example FIGS. 1A to 1F are sectional views illustrating a procedure for manufacturing a semiconductor transistor according to embodiments;

Example FIGS. 2A to 2D are scanning electron microscope (SEM) photographs of gate patterns formed in accordance with embodiments; and Example FIG. 3 is a graph depicting the correlation between a final inspection critical dimension (FICD) and a develop inspection critical dimension (DICD), based on the results of a design of experience (DoE) inspection for a gate pattern formed through an etching process according to embodiments.

DESCRIPTION

Embodiments will be described in conjunction with a technique, in which a gate constituting a transistor is formed with a line width meeting a given design rule. In particular, embodiments will be described in conjunction with a technique for forming a gate, using polysilicon. The line width of a polysilicon gate is a very important factor in determining the length of the gate. The length of the gate has influence on the switching speed of the associated transistor. That is, the transistor can switch at a higher speed when the gate length is reduced. However, the reduction in gate length should meet the given design rule. The doping concentration and profile of impurities are designed to satisfy the length of the specific gate. The leakage current increases if the length of gate becomes shorter than that of the design rule.

Example FIGS. 1A to 1F are sectional views illustrating a procedure for manufacturing a semiconductor transistor according to embodiments. Referring to example FIG. 1A, a gate oxide film 20 is coated over a semiconductor substrate 10. A gate conductor 30 is formed over the gate oxide film 20. For example, the semiconductor substrate 10 may be made of silicon, the gate oxide film 20 may be made of a silicon oxide ($SiO_2$), and the gate conductor 30 may be made of polysilicon.

Figure 1B:
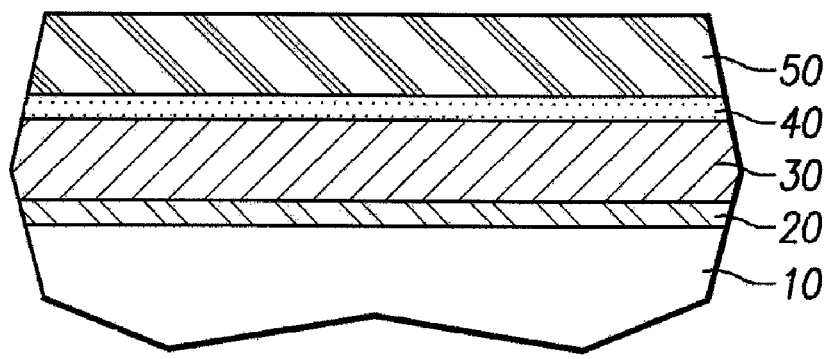

Thereafter, an antireflective coating (ARC) 40 and a photoresist film are formed over the gate conductor 30, as shown in example FIG. 1B. The ARC 40, which is an organic ARC, functions to avoid standing wave effects caused by the interference between light incident to the photoresist film 50 during light exposure and reflected light emerging from the substrate. ARC 40 also avoids reflections caused by the topology of the underlayer or diffused reflection at corners. The organic ARC 40 may be, for example, spin coated over the gate conductor 30.

Figure 1C:
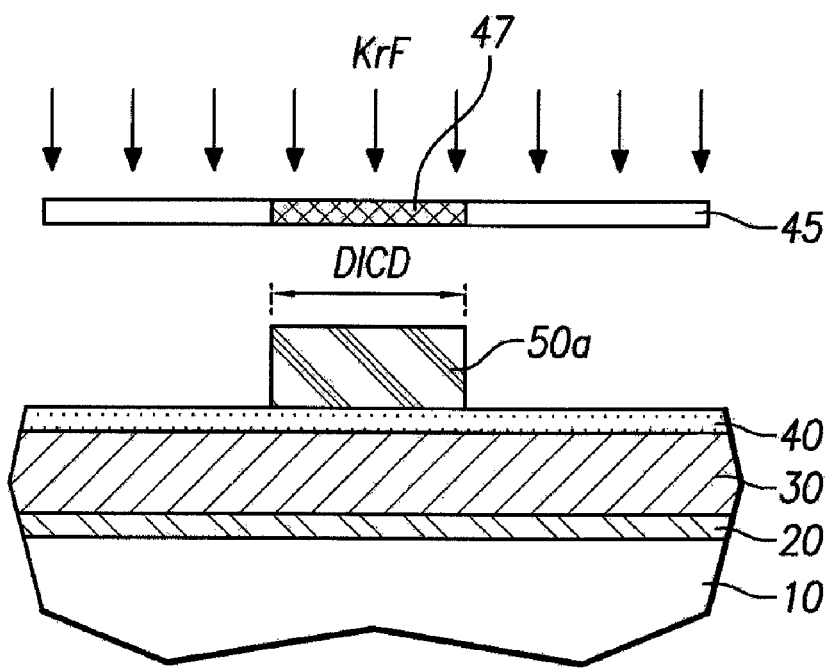
Figure 1D:
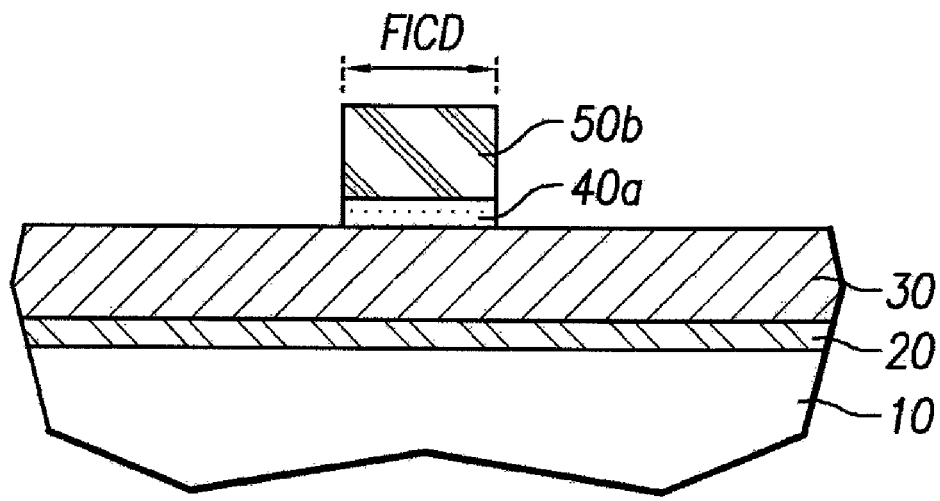

Referring to example FIG. 1C, a mask 45 formed with a gate pattern 47 may be arranged over the photoresist film 50 in an aligned state. Using a KrF light source, the photoresist film 50 may be exposed. Thereafter, the photoresist film 50 may be developed, to form a first photoresist film pattern 50a. As shown in example FIG. 1C, the first photoresist film pattern 50a may be transferred from the gate pattern 47 of the mask 45. The first photoresist film pattern 50a may have a critical dimension corresponding to a develop inspection critical dimension (DICD). The DICD means a critical dimension obtained after developing the photoresist film.

The first photoresist film pattern 50a, which may have a critical dimension corresponding to a DICD in embodiments, is considerably larger than the critical dimension of the gate conductor, which is a target design value. For example, the CD of the final gate conductor, which is a target design value, is 90 nm, whereas the DICD of the photoresist film pattern 50a is 130 nm.

Referring to example FIG. ID, the ARC 40 may be etched under the condition, in which the first photoresist film pattern 50a having a critical dimension corresponding to a DICD is used as a mask, thereby forming an ARC pattern 40a. Here, it should be noted that, when the ARC 40 is etched, the first photoresist film pattern 50a is also laterally etched, thereby forming a second photoresist film pattern 50b, so that each of the second photoresist film pattern 50b and ARC pattern 40a has a critical dimension corresponding to a final inspection critical dimension (FICD) considerably smaller than the associated DICD. In accordance with embodiments, the ARC 40 is formed into the ARC pattern 40a through an etching process using a $CF_4$ gas. In embodiments, the conditions of the etching process for forming the ARC pattern 40a are as follows:

Approximately 10-30 mT/approximately 500-1000 W, approximately 30-70 W/$HeO_2$ of approximately 40-70 sccm, $CF_4$ of approximately 100-200 sccm, Ar of approximately 100-200 sccm/B.He12, approximately 4 T. (That is, the etching process is carried out after forming plasma by supplying certain amounts of $HeO_2$, $CF_4$, and Ar gases at a chamber pressure of approximately 10-30 mT for example, 16 mT, a source power of approximately 500-1000 W for example, 850 W, and a bias power of approximately 30-70 W for example, 40 W, and an He gas is supplied in an amount of approximately 12 sccm at a pressure of 4 T to the back surface of a wafer, in order to eliminate an etching amount difference.).

Figure 1E:
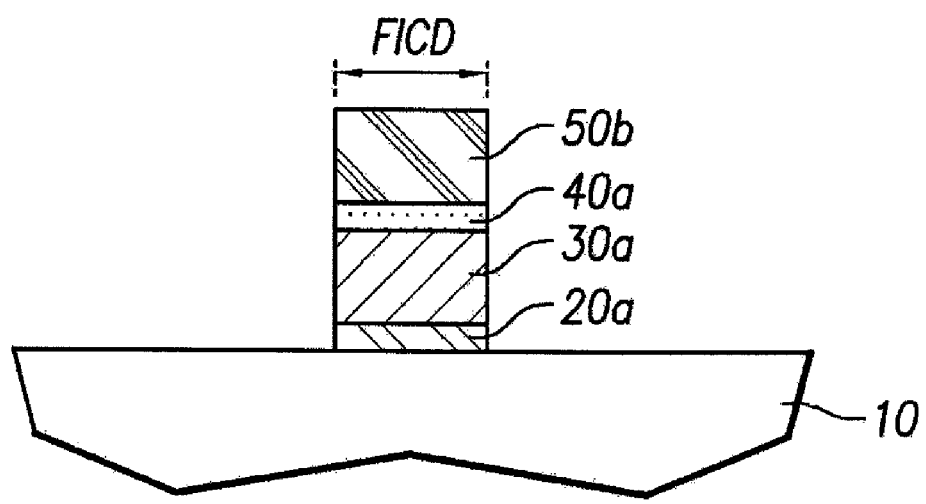

Referring to example FIG. 1E, the gate conductor 30 and gate oxide film 20 may be selectively etched using the second photoresist film pattern 50b and ARC pattern 40a as mask, thereby forming a gate conductor pattern 30a and a gate oxide film pattern 20a.

In accordance with embodiments, the etching of the gate conductor 30 to form the gate conductor pattern 30a is carried out using an $HBr/Cl_2$ gas. In embodiments, the conditions of the etching process using the $HBr/Cl_2$ gas are as follows:

(1) Main Etching:
Approximately 3-10 mT/approximately 400-1000 W, approximately 50-200 W/30-80$Cl_2$,150-300HBr,15-30$HeO_2$/B.He10,6 T (That is, the etching process is carried out after forming plasma by supplying certain amounts of $Cl_2$, HBr, and $HeO_2$ gases at a chamber pressure of approximately 3 through 10 mT for example, 4 mT, a source power of approximately 400 through 1000 W for example, 600 W, and a bias power of approximately 50 through 200 for example, 100 W, while using an end point, and an He gas is supplied in an amount of approximately 10 sccm at a pressure of approximately 6 T to the back surface of the wafer, in order to eliminate an etching amount difference.).

(2) Soft Landing:
Approximately 15-40 mT/approximately 300-600 W, 40-100 W/50-150$Cl_2$,200-400HBr,20-50$HeO_2$/B.He10,6 T (That is, the etching process is carried out after forming plasma by supplying certain amounts of $Cl_2$, HBr, and $HeO_2$ gases at a chamber pressure of approximately 15 through 40 for example, 25 mT, a source power of approximately 300 through 600 for example, 450 W, and a bias power of approximately 40 through 100 W for example, 75 W, and an He gas is supplied in an amount of approximately 10 sccm at a pressure of approximately 6 T to the back surface of the wafer, in order to eliminate an etching amount difference.).

(3) Over-etching:
Approximately 50-100 mT/approximately 500-1000 W, approximately 40-100 W/approximately 200-700HBr, approximately 5-30$HeO_2$/B.He8,8 T (That is, the etching process is carried out after forming plasma by supplying certain amounts of HBr and $HeO_2$ gases at a chamber pressure of approximately 50 through 100 for example, 70 mT, a source power of approximately 500 through 1000 for example, 750 W, and a bias power of approximately 40 through 100 W for example, 60 W, and an He gas is supplied in an amount of 8 sccm at a pressure of 8 T to the back surface of the wafer, in order to eliminate an etching amount difference.).

Here, the "soft landing" means a process for etching the gate conductor remaining after the completion of the main etching, and the "over-etching" means a process for etching the gate conductor remaining in a region such as a shallow trench isolation (STI) divot.

Figure 1F:
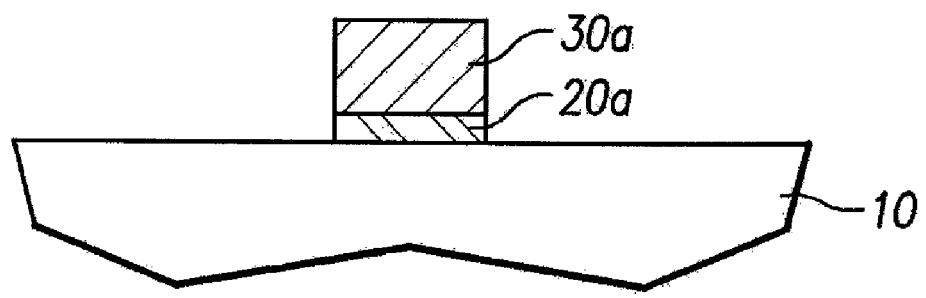

Thereafter, as shown in example FIG. 1F, the ARC pattern 40a and second photoresist film pattern 50b arranged over the gate conductor pattern 30a are removed, to obtain a gate pattern having an FICD corresponding to a final design value.

Example FIGS. 2A to 2D are scanning electron microscope (SEM) photographs of gate patterns formed in accordance with embodiments. Referring to example FIGS. 2A to 2D, it can be seen that the FICD obtained after the completion of the final over-etching process was 85 nm, and the CD deviation, namely, "DICD-FICD", was about 33 nm. It can also be seen that, even after the over-etching process, there was no damage to the gate oxide film arranged beneath the polysilicon.

Example FIGS. 2B and 2C show the results obtained when the main etching is carried out through two processing procedures. In this case, the polysilicon gate conductor is etched to a certain degree in a primary main etching procedure, and the polysilicon gate conductor remaining without being etched in the primary main etching procedure is completely etched in a secondary main etching procedure.

Example FIG. 3 is a graph depicting the correlation between an FICD and a DICD, based on the results of a design of experience (DoE) inspection for the gate pattern formed through the etching process according to embodiments. As can be seen from example FIG. 3, the FICD and DICD exhibit very strong linearity. From this phenomenon, it can be indirectly identified that it is possible to realize a pattern having a small CD using a KrF light source, in accordance with the etching process of embodiments.

The graph of example FIG. 3 depicts the results obtained by measuring a variation in FICD while varying the DICD from 0.100 μm to 0.300 μm, and by analyzing the results through a 6-σ regression method. Referring to the analysis results depicted in this graph, the FICD exhibits a correlation of "0.98*DICD-0.03 μm" to DICD. Also, under the conditions of R-sq=100% and 95% Cl, a P-value of 0.000 is exhibited. This value means that the correlation equation is reasonable.

As apparent from the above description, in accordance with embodiments, it is possible to provide a method for manufacturing a semiconductor device of a 100 nm grade or lower, using a KrF light source, without using an ArF light source requiring the use of expensive equipment and a specific photoresist material. Accordingly, it is possible to achieve an enhancement in productivity while reducing the manufacturing costs of the semiconductor device.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus configured to:
   form an oxide film over a semiconductor substrate;
   form a gate conductor over the oxide film;
   form an antireflective film over the gate conductor;
   form a photoresist film over the antireflective film;
   photo-etch the photoresist film, thereby forming a first photoresist film pattern having a first line width;
   etch the antireflective film, using the first photoresist film pattern as a mask, thereby forming an antireflective film pattern, and simultaneously laterally etch the first photoresist film pattern, thereby forming a second photoresist film pattern having a second line width corresponding to a final design value for the gate conductor; and
   etch the gate conductor and the oxide film, using the second photoresist film pattern and the antireflective film pattern as a mask, thereby forming a gate conductor pattern and an oxide film pattern,
   wherein the photo-etch to form the first photoresist film pattern is executed using a KrF light source.

2. The apparatus of claim 1, wherein the apparatus configured to etch the antireflective film to form the antireflective film pattern uses a $CF_4$ gas.

3. The apparatus of claim 2, wherein the apparatus configured to etch the antireflective film uses process conditions of approximately 10 through 30 mT (chamber pressure)/approximately 500 through 1000 W (source power), approximately 30 through 70 W(bias power)/$HeO_2$ of approximately 40 through 70 sccm, $CF_4$ of approximately 100 through 200 sccm, and Ar of approximately 100 through 200 sccm.

4. The apparatus of claim 1, wherein the apparatus configured to etch the gate conductor, using the second photoresist film pattern and the antireflective film pattern as mask, comprises an apparatus to perform a main etching procedure, a apparatus to perform a soft landing procedure, and an apparatus to perform an over-etching procedure.

5. The apparatus of claim 4, wherein the apparatus to perform the main etching procedure, the soft landing procedure, and the over-etching procedure uses an $HBr/Cl_2$ gas.

6. The apparatus of claim 4, wherein the apparatus to perform a main etching procedure uses process conditions of approximately 3 through 10 mT(chamber pressure)/approximately 400 through 1000 W(source power), approximately 50 through 200 W(bias power)/$Cl_2$ of approximately 30 through 80 sccm, HBr of approximately 150 through 300 sccm, $HeO_2$ of approximately 15 through 30 sccm.

7. The apparatus of claim 4, wherein the apparatus to perform a soft landing procedure uses process conditions of approximately 15 through 40 mT (chamber pressure)/approximately 300 through 600 W (source power), approximately 40 through 100 W(bias power)/$Cl_2$ of approximately 50 through 150 sccm, HBr of approximately 200 through 400 sccm, $HeO_2$ of approximately 20 through 50 sccm.

8. The apparatus of claim 4, wherein an apparatus to perform the over-etch procedure uses process conditions of approximately 50 through 100 mT (chamber pressure)/approximately 500 through 1000 W (source power), approximately 40 through 100 W(bias power)/HBr of approximately 200 through 700 sccm, $HeO_2$ of approximately 5 through 30 sccm.

* * * * *